(12) United States Patent
Horiguchi (10) Patent No.: US 7,655,111 B2
(45) Date of Patent: Feb. 2, 2010

(54) PLASMA PROCESSING APPARATUS AND PLASMA PROCESSING METHOD

(75) Inventor: Takahiro Horiguchi, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/653,895

(22) Filed: Jan. 17, 2007

(65) Prior Publication Data
US 2007/0163996 A1    Jul. 19, 2007

(30) Foreign Application Priority Data
Jan. 18, 2006  (JP)  ............................. 2006-010131

(51) Int. Cl.
C23C 16/00    (2006.01)
C23F 1/00     (2006.01)
H01L 21/306   (2006.01)

(52) U.S. Cl. ............................. 156/345.41; 156/345.36; 156/345.48; 118/723 MW; 118/715; 118/723 E; 118/723 I (58) Field of Classification Search ......... 118/723 MW; 156/345.41, 345.33, 345.34
See application file for complete search history.

(56) References Cited

U.S. PATENT DOCUMENTS

| | | | |
|---|---|---|---|
| 5,525,159 A | | 6/1996 | Hama et al. |
| 5,645,644 A | * | 7/1997 | Mabuchi et al. ..... 118/723 MW |
| 5,996,528 A | * | 12/1999 | Berrian et al. ........... 118/723 E |
| 6,013,155 A | * | 1/2000 | McMillin et al. ........ 156/345.33 |
| 2004/0107910 A1 | * | 6/2004 | Nakata et al. ....... 118/723 MW |
| 2005/0087302 A1 | * | 4/2005 | Mardian et al. ........ 156/345.33 |
| 2005/0109279 A1 | * | 5/2005 | Suzuki ............... 118/723 MW |

FOREIGN PATENT DOCUMENTS

| | | |
|---|---|---|
| JP | 7-312348 | 11/1995 |
| JP | 2001-135627 | 5/2001 |

OTHER PUBLICATIONS

JP 2001-135267_Eng_May 18, 2001.*

* cited by examiner

*Primary Examiner*—Parviz Hassanzadeh
*Assistant Examiner*—Rakesh K Dhingra
(74) *Attorney, Agent, or Firm*—Finnegan, Henderson, Farabow, Garrett & Dunner, LLP (57) ABSTRACT

At a frame 26 in a microwave plasma processing apparatus 100, numerous horizontal spray gas nozzles 27 formed therein injection holes A and numerous vertical gas nozzles 28 formed therein injection holes B are fixed. A first gas supply means 50 injects argon gas through the injection holes A into an area near each dielectric parts 31a. A second gas supply means 55 injects silane gas and hydrogen gas through the injection holes B into a position at which the gases do not become over-dissociated. The gases injected as described above are raised to plasma with a microwave transmitted through each dielectric parts 31a. Since the vertical gas nozzles 28 are mounted at positions at which they do not block the flow of plasma traveling toward a substrate G, ions and electrons do not collide with the vertical gas nozzles 28 readily.

15 Claims, 6 Drawing Sheets

PLASMA PROCESSING APPARATUS AND PLASMA PROCESSING METHOD

CROSS-REFERENCE TO RELATED APPLICATION

This application is based upon and claims the benefit of priority from Japanese Patent Application No. 2006-10131, filed on Jan. 18, 2006, the entire content of which is incorporated herein by reference.

BACKGROUND OF THE INVENTION

1. Field of the Invention

The present invention relates to a plasma processing apparatus and a plasma processing method for plasma processing a workpiece by generating plasma. More specifically, the present invention relates to how a processing gas to be used to generate plasma may be supplied.

2. Description of the Related Art

There are plasma processing apparatuses proposed in the related art that adopt a dual gas supply system whereby a plurality of different types of processing gases are supplied through two gas supply mechanisms (e.g., gas shower heads) separately disposed at an upper level and a lower level inside the processing container. In such a plasma processing apparatus, the upper-level gas shower is positioned above the lower-level gas shower head, and injects a non-depository gas such as argon.

The lower-level gas shower head is positioned above and parallel to the substrate, and injects a processing gas such as silane gas. With the different types of gases injected at specific positions within the processing container as described above, plasma is generated as desired and desirable plasma processing is executed on the substrate with the plasma thus generated.

However, the structure with the lower-level gas shower head disposed parallel to the substrate poses a problem in that great quantities of ions and electrons contained in the plasma collide with the lower-level gas shower head, which leads to overheating of the lower-level gas shower head and results in reaction product becoming settled on the lower-level gas shower head in large quantity. Consequently, the pile of deposit accumulating at the lower-level gas shower head becomes thicker than a certain level, peels off the lower-level gas shower head and settles onto the substrate as particles in a relatively short period of time.

The lower-level gas shower head having become heated during the processing operation is then cooled while the substrate is transferred into/out of a load lock chamber. Since the lower-level gas shower head is constituted of a dielectric member, it does not transfer heat readily. This means that the heat applied to the lower-level gas shower head as ions and electrons collide with the lower-level gas shower head is not readily transmitted to the outside. Thus, if ions and electrons collide with the lower-level gas shower head in great quantities, the lower-level gas shower head becomes overheated during the processing operation and then becomes rapidly cooled during the transfer operation. As the lower-level gas shower head is repeatedly heated and cooled, as described above, the temperature at the lower-level gas shower head undergoes drastic fluctuations.

Under such circumstances, the difference between the thermal expansion coefficient of the deposit (reaction product) and the thermal expansion coefficient of the lower-level gas shower head becomes a more significant factor to allow the deposit to peel off the lower-level gas shower head more readily. This, in turn, further reduces the length of time to elapse before the deposit settles onto the substrate as particles. This issue of particles settling on the substrate may be addressed by cleaning the inside of the processing container in shorter cycles. However, this solution leads to another problem in that the throughput is adversely affected to lower the productivity.

There is another problem in that if the flow of plasma being diffused toward the substrate is blocked by the lower-level gas shower head and great quantities of ions and electrons collide with the lower-level gas shower head, a significant extent of energy loss due to the collisions occurs, to result in plasma decay, which in turn, lowers the reaction velocity (e.g., deposition rate) at the substrate.

The present invention addresses the problems discussed above by providing a plasma processing apparatus that includes a gas injection member disposed at a position where the gas injection member does not block the flow of plasma onto a workpiece and a plasma processing method that may be adopted in the plasma processing.

SUMMARY OF THE INVENTION

Namely, it is an aspect of the present invention to provide a plasma processing apparatus including a dielectric member that allows microwaves propagated through a waveguide and passed through a slot to be transmitted, a plurality of first gas injection members formed therein first injection holes and disposed at predetermined positions at a frame supporting the dielectric member, a plurality of second gas injection members formed therein second injection holes located at positions lower than the first injection holes disposed at predetermined positions at the frame so as not to block the flow of plasma onto a workpiece, a first gas supply means 50 that injects a first processing gas to a desired position within a processing chamber through the first injection holes at the first gas injection members, a second gas supply means 55 that injects through the second injection holes at the second gas injection members a second processing gas to a position lower than the position at which the first processing gas is injected and the processing chamber where the workpiece is processed with plasma generated by raising the first processing gas and the second processing gas to plasma with the microwaves.

It is another aspect of the present invention to provide a plasma processing method including steps for transmitting through a dielectric member microwaves propagated through a waveguide and passed through a slot, injecting a first processing gas to a desired position within a processing chamber through first injection holes at a plurality of first gas injection members each disposed at a predetermined position of a frame supporting the dielectric member, injecting a second processing gas to through second injection holes at a plurality of second gas injection members disposed at predetermined positions at the frame so as not to block the flow of plasma toward a workpiece, with the second injection holes set lower than the first injection holes at a position lower than the position at which the first processing gas is injected and raising to plasma the first processing gas and the second processing gas injected, with the microwaves and processing the workpiece with the plasma.

BRIEF DESCRIPTION OF THE DRAWINGS

The accompanying drawings, which are incorporated in and constitute a part of this specification, illustrate embodiments of the invention and together with the description, serve to explain the principles of the invention.

DESCRIPTION OF THE EMBODIMENTS

The following is a detailed explanation of the preferred embodiments of the present invention, given in reference to the attached drawings. It is to be noted that in the following explanation and the attached drawings, the same reference numerals are assigned to components having identical structural features and functions to preclude the necessity for a repeated explanation thereof.

In addition, the description in the specification is provided by assuming that 1 mTorr is substantially-equal to $(10^{-3} \times 101325/760)$ Pa and that 1 sccm is substantially equal to $(10^{-6}/60)$ m$^3$/sec.

Figure 1:
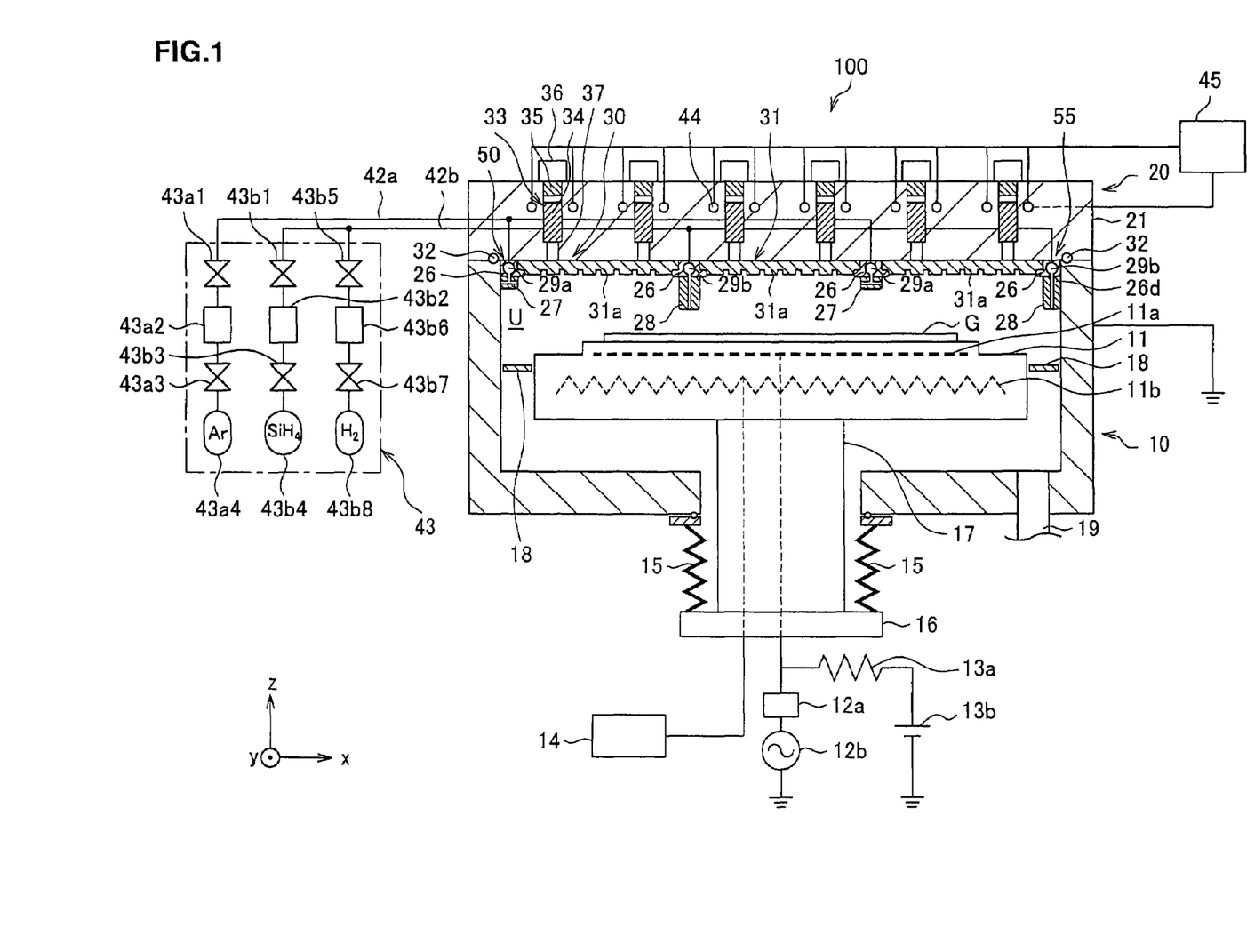
FIG. 1 is a sectional view of the microwave plasma processing apparatus achieved in an embodiment of the present invention.
Figure 2:
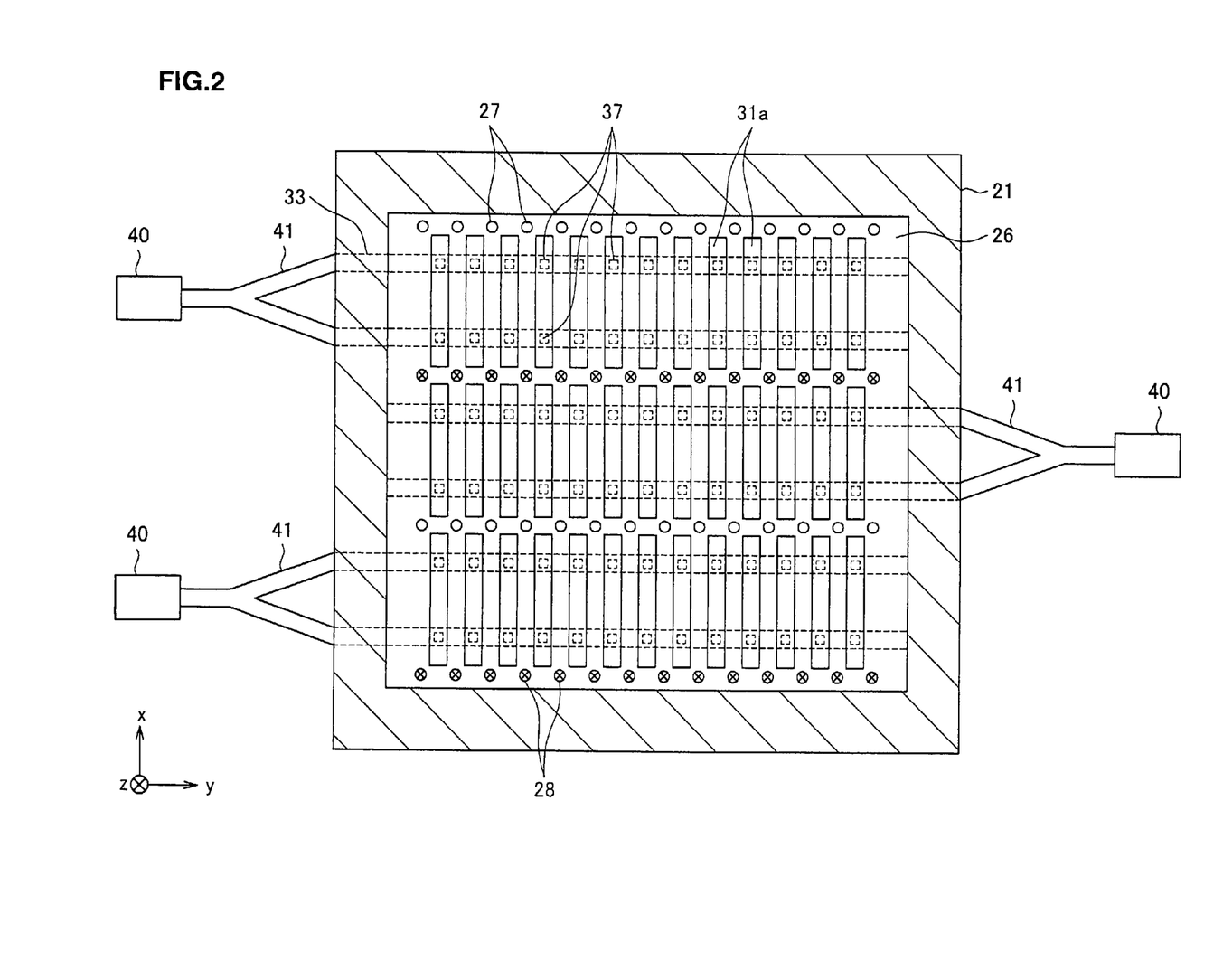
FIG. 2 is a view of ceiling of the processing container achieved in the embodiment.

First, in reference to FIG. 1 presenting a sectional view of the microwave plasma processing apparatus achieved in an embodiment of the present invention, taken along the longitudinal direction (the direction perpendicular to the y-axis) and FIG. 2 presenting a view of the ceiling of the processing chamber, the structure adopted in the microwave processing apparatus is explained. It is to be noted that the following explanation focuses on an amorphous silicon CVD (chemical vapor deposition) process executed in the microwave plasma processing apparatus (one example for the "plasma processing apparatus") achieved in the embodiment.

(Structure Adopted in the Microwave Plasma Processing Apparatus)

A microwave plasma processing apparatus 100 includes a processing container 10 and a lid 20. The processing container 10 assumes a rectangular parallelepiped shape with an open top and a solid-bottom. The processing container 10 and the lid 20 are sealed together via an O-ring 32 disposed between the external circumference of the bottom surface of the lid 20 (lid main body 21) and the external circumference of the top surface of the processing container 10, thereby forming a processing chamber U where plasma processing is executed. The processing container 10 and the lid 20, which may be constituted of a metal such as aluminum, are electrically grounded.

Inside the processing container 10, a susceptor 11 (stage) on which a glass substrate (hereafter referred to as a "substrate") G is placed is disposed. Inside the susceptor 11 constituted of, for instance, aluminum nitride, a power supply unit 11a and a heater 11b are installed.

A high-frequency power source 12b is connected to the power supply unit 11a via a matcher 12a (e.g., a capacitor). In addition, a high-voltage DC power source 13b is connected to the power supply unit 11a via a coil 13a. The matcher 12a, the high-frequency power source 12b, the coil 13a and the high-voltage DC power source 13b are all disposed outside the processing container 10. The high-frequency power source 12b and the high-voltage DC power source 13b are grounded.

The power supply unit 11a applies a predetermined level of bias voltage into the processing container 10 by using high-frequency power output from the high-frequency power source 12b. In addition, the power supply unit 11a electrostatically adsorbs the substrate G with a DC voltage output from the high-voltage DC power source 13b.

An AC power source 14 disposed outside the processing container 10 is connected to the heater 11b, and the heater 11b thus maintains the temperature of the substrate G at a predetermined level by using an AC voltage output from the AC power source 14.

A cylindrical opening is formed at the bottom surface of the processing container 10, with one end of a bellows 15 attached to the circumferential edge of the opening on the bottom side. The other end of the bellows 15 is locked to an elevator plate 16. The opening at the bottom surface of the processing container 10 is thus sealed with the bellows 15 and the elevator plate 16.

The susceptor 11, supported at a cylindrical member 17 disposed on the elevator plate 16, moves up and down as one with the elevator plate 16 and the cylindrical member 17, so as to adjust the height of the susceptor 11 at a position optimal for a specific processing operation. In addition, a baffle plate 18 is disposed around the susceptor 11 in order to control the gas flow in the processing chamber U in the optimal state.

A vacuum pump (not shown) disposed outside the processing container 10 is provided near the bottom of the processing container 10. As the gas is discharged with the vacuum pump from the processing container 10 via a gas discharge pipe 19, the pressure inside the processing chamber U is lowered until a desired degree of vacuum is achieved.

At the lid 20, the lid main body 21, six rectangular waveguides 33, a slot antenna 30 and a dielectric member 31 constituted with a plurality of dielectric parts 31a are disposed.

The six rectangular waveguides 33 (equivalent to the "waveguide") have a rectangular section and are disposed parallel to one another inside the lid main body 21. The space inside each waveguide is filled with a dielectric material 34 such as a fluororesin (e.g., Teflon™), alumina (Al2O3) or quartz. Thus, the guide wavelength λg1 within each rectangular waveguide 33 is controlled as indicated in expression; $\lambda g1=\lambda c/\in1)^{1/2}$. Λc and ∈1 in the expression respectively represent the wavelength in free space and the dielectric constant of the dielectric member 34.

The rectangular waveguides 33 each have an open top through which a movable portion 35 is allowed to move up/down freely. The movable portion 35 is constituted of a nonmagnetic, electrically conductive material such as aluminum.

Outside the lid main body 21, an elevator mechanism 36 is disposed at the upper surface of each movable portion 35 so as to move the movable portion 35 up/down. This structure allows the movable portion 35 to move to a point level with the upper surface of the dielectric material 34 so as to freely adjust the height of the rectangular waveguide 33.

The slot antenna 30, located on the bottom side of the lid main body 21, is formed as an integrated part of the lid main body 21. The slot antenna 30 is constituted of a nonmagnetic metal such as aluminum. 13 slots (37 openings) of the slot antenna 30 are formed in series, as shown in FIG. 2, at the bottom surface of each rectangular waveguide 33. The space inside each slot 37 is filled with a dielectric member constituted of a fluororesin, alumina (Al2O3) or quartz and the dielectric member enables control of the guide wavelength λ $g_2$ inside each slot 37, as indicated in expression: $\lambda g_2 = \lambda c/\epsilon_2)^{1/2}$. λc and $\epsilon_2$ in the expression respectively represent the wavelength in free space and the dielectric constant of the dielectric member inside the slot 37.

(Dielectric Member 31)

As shown in FIG. 2, the dielectric member 31 is constituted with 39 dielectric parts 31a. The dielectric parts 31a each forming the shape of a tile, are disposed at the ceiling of the processing container 10 over three rows with 13 dielectric parts 31a set in each row so that each row of dielectric parts ranges over two rectangular waveguides 33 connected to a common microwave generator 40 via a Y branch pipe 41.

Each dielectric part 31a is installed so as to range over two slots with y coordinates equal to each other among the 26 (13 slots×2 rows) slots 37 formed at the bottom surfaces of the two adjacent rectangular waveguides 33 (i.e., the two rectangular waveguides 33 connected to a common microwave generator 40 via a Y branch pipe 41).

The structure described above includes a total of 39 (13×3 rows) dielectric parts 31a mounted at the bottom surface of the slot antenna 30. It is to be noted that any number of slots 37 may be formed at the bottom surface of each rectangular waveguide 33. Twelve slots 37, for instance, may be formed at the bottom surface of each rectangular waveguide 33 and a total of 36 (12×3 rows) dielectric parts 31a may be disposed at the bottom surface of the slot antenna 30, instead. In addition, the quantity of slots 37 present at the top surface of each dielectric part 31a does not need to be two, and there may be a single slot 37 or three or more slots 37 present at the top surface of each dielectric part 31a.

Figure 3:
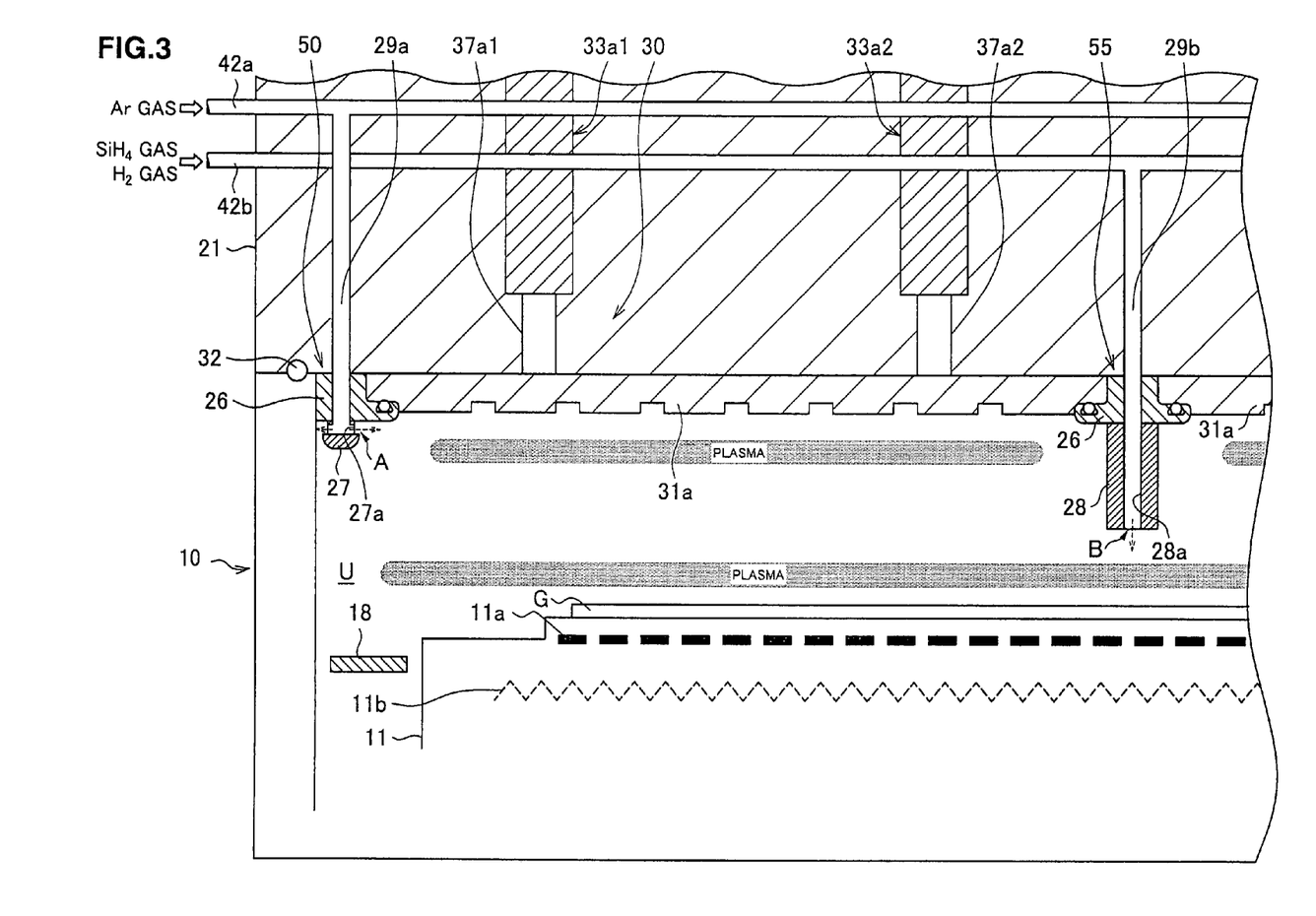
FIG. 3 is an enlargement of an area around the gas nozzles in FIG. 1.

As shown in FIGS. 1 and 3, concaves and convexes are formed at the surface of each dielectric part 31a facing opposite the substrate G, as shown in FIGS. 1 and 3. The presence of at least either concaves or convexes formed at the surface of the dielectric part 31a increases the loss of electrical field energy as the surface wave is propagated over the surface of the dielectric part 31a and thus, the extent of surface wave propagation is minimized. As a result, the occurrence of a standing wave is inhibited, thereby assuring generation of uniform plasma.

At the bottom surface of the slot antenna 30, a latticed frame 26 is disposed so as to support the 39 dielectric parts 31a disposed over the three rows with 13 dielectric parts set in each row, as shown in FIGS. 1 and 2. The frame 26 is constituted of a nonmagnetic material such as aluminum.

(Horizontal Spray Gas Nozzles 27 and Vertical Gas Nozzles 28)

As shown in FIG. 3, horizontal spray gas nozzles 27 and vertical gas nozzles 28 are fixed onto the frame 26 so that they are suspended from the frame 26 parallel to each other at the bottom surface of the frame 26.

Figure 4:
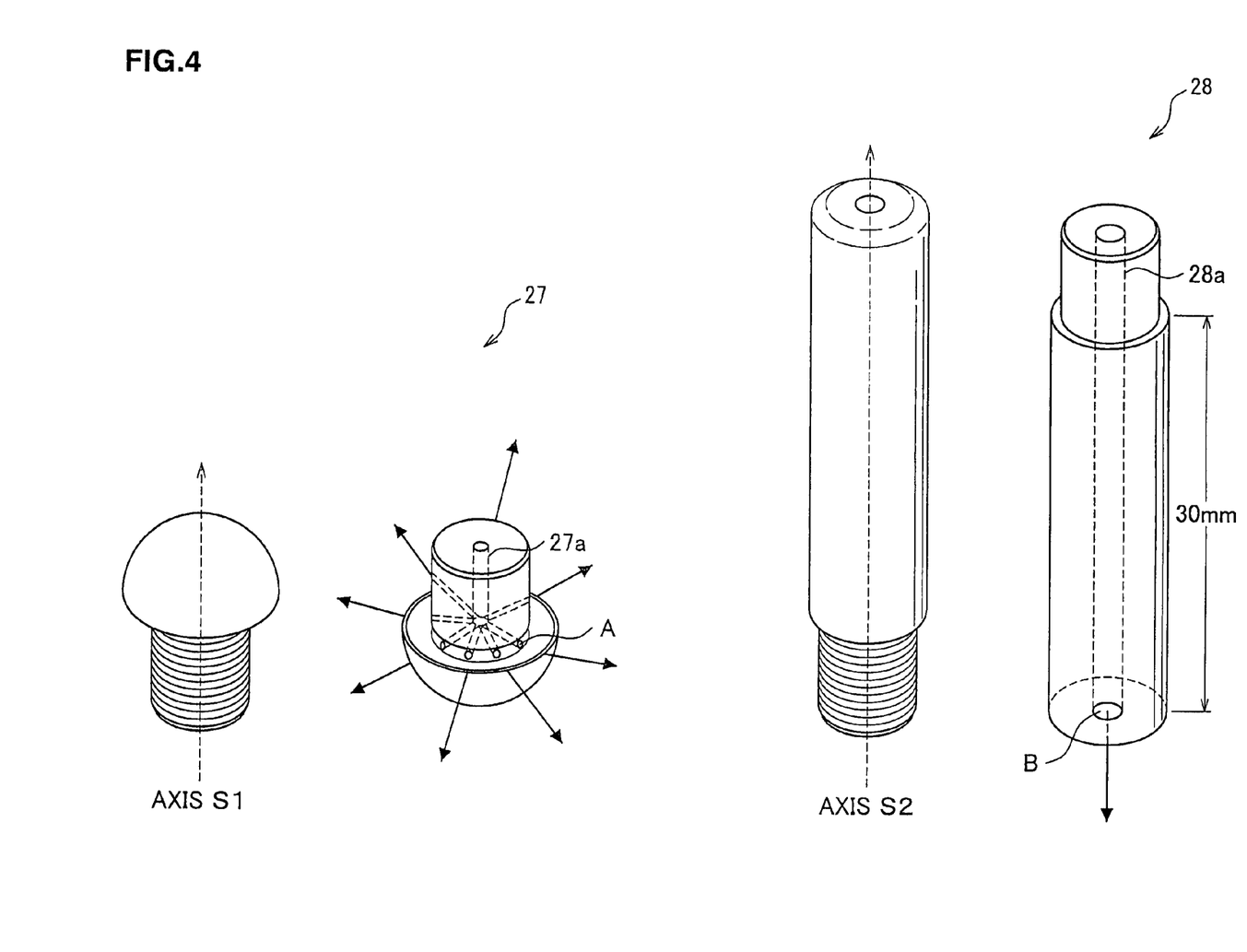
FIG. 4 shows an example of the structures of the horizontal spray gas nozzles and the vertical gas nozzles (namely, the icicle-shaped gas nozzles)

As shown in FIG. 4, the horizontal spray gas nozzles 27 are screws assuming a mushroom shape on the outside and are constituted of metal. Inside each horizontal spray gas nozzle 27, a hollow space is formed as a gas passage 27a ranging from the bottom of the horizontal spray gas nozzle 27 along the lengthwise direction (along the axis S1). The gas passage 27a passes through the horizontal spray gas nozzle 27 as it branches out in eight directions (radially) running perpendicular (transverse) to the axis S1. These eight openings are hereafter referred to as injection holes A. It is to be noted that the horizontal spray gas nozzles 27 correspond to the "first gas injection members" and that the injection holes A correspond to the "first injection holes".

The vertical gas nozzles 28 are screws assuming a rod shape (cylindrical shape) on the outside and are constituted of metal. A hollow space constituting a gas passage 28a passes through each vertical gas nozzle 28, extending from the bottom of the vertical gas nozzle 28 along the lengthwise direction (along the axis S2). The opening at the front end of the vertical gas nozzle 28 is hereafter referred to as an injection hole B. It is to be noted that the vertical gas nozzles 28 correspond to the "second gas injection members" and that the injection hole B corresponds to the second injection holes.

The measurement of the vertical gas nozzles 28 taken along the length thereof (along the axis S2) is greater than the corresponding measurement of the horizontal spray gas nozzles 27. The measurement should be at least great enough to allow a silane gas and the hydrogen gas to be sprayed out to a position at which the silane gas and a hydrogen gas do not become overly dissociated, but the measurement should also be small enough so that the vertical gas nozzles 28 do not block plasma as it is diffused onto the substrate G, i.e., so that the vertical gas nozzles 28 do not form a barrier as the plasma is diffused onto the substrate G. It is preferably set this length equal to or less than 30 mm. It is to be noted that the vertical gas nozzles 28 may assume the shape of a plate.

The gas nozzles may be locked by, for instance, forming numerous insertion holes with threaded inner surfaces at the bottom surface of the frame 26, inserting the horizontal spray gas nozzles 27 and the vertical gas nozzles 28 at the insertion holes and interlocking the threaded portions of the insertion holes and the nozzles. Alternatively, the gas nozzles may be locked onto the frame 26 with an adhesive or they may be mounted at the frame 26 by using a mounting tool. With the gas nozzles fixed onto the frame 26, as described above, the injection holes A are made to open near the dielectric parts 31a along a direction parallel with the substrate G and the injection holes B are made to open toward direction perpendicular to the substrate G. Two rows of horizontal spray gas nozzles 27 with 14 horizontal spray gas nozzles 27 set in each row and two rows of vertical gas nozzles 28 with 14 vertical gas nozzles 28 set in each row are disposed alternately in a regular pattern at the bottom surface of the frame 26, as shown in FIG. 2.

A processing gas supply source 43 in FIG. 1 is constituted with a plurality of valves (valves 43a1, 43a3, 43b1, 43b3, 43b5 and 43b7), a plurality of mass flow controllers (mass flow controllers 43a2, 43b2 and 43b6), and argon gas supply source 43a4, a silane gas supply source 43b4 and a hydrogen gas supply source 43b8.

Argon gas, silane gas and hydrogen gas, each achieving a desired level of concentration, are supplied into the processing container 10 from the processing gas supply source 43 by individually controlling the open/closed states of valves (the valves 43a1, 43a3, 43b1, 43b3, 43b5 and 43b7) and the degrees of openness of the mass flow controllers (mass flow controllers 43a2, 43b2 and 43b6).

A first gas supply pipe 29a passes through the frame 26 and connects with the gas passage 27a at each horizontal spray gas nozzle 27. Thus, continuity is achieved from the argon gas supply source 43a4 to the injection holes A via a single pipe. A second gas supply pipe 29b also passes through the frame 26 and connects with the gas passage 28a at each vertical gas nozzle 28. Thus, continuity is achieved from the silane gas supply source 43b4 and the hydrogen gas supply source 43b8 to the injection hole B via a single pipe.

A cooling water pipes 44 in FIG. 1 is connected with a cooling water supply source 45 installed outside the microwave plasma processing apparatus 100 and as cooling water supplied from a cooling water supply source 45 circulates through the cooling water pipes 44 and returns to the cooling water supply source 45, the temperature at the lid main body 21 is maintained at a desired level.

As the individual processing gases are raised to plasma with 2.45 GHz×3 microwaves output from the three microwave generators 40 in FIG. 2 in the plasma processing apparatus adopting the structure described above, an amorphous silicon film is formed by plasma on the substrate G.

(Amorphous Silicon Film Formation)

Next, the formation of an amorphous silicon film, achieved via the microwave plasma processing apparatus 100 in the embodiment, is explained in detail in reference to FIGS. 1 and 3.

First, the operations of a first gas supply means 50 and a second gas supply means 55 are explained. As shown in FIG. 1 and also in the partial enlargement presented in FIG. 3, the first gas supply means 50 supplies the argon gas (corresponds to the "first processing gas") from the argon gas supply source 43a4 to the plurality of horizontal spray gas nozzles 27 (see FIG. 2) secured at specific positions of the frame 26 via a first flow passage 42a and the first gas supply pipes 29a. As a result, the argon gas is injected along the transverse direction in the vicinity of the bottom surfaces of the each dielectric parts 31a through the injection holes A open along directions substantially parallel to the substrate G in the vicinity of the dielectric parts 31.

As shown in FIG. 2, for instance, microwaves having been propagated through the rectangular waveguides 33a1 and 33a2, passed through the slots 37a1 and 37a2, are transmitted through the dielectric parts 31a and thus enter the processing chamber U. Since the argon gas is injected only in the areas near the bottom surfaces of the dielectric parts 31a, it is allowed to dissociate efficiently with the electrical field energy of the intense microwaves immediately after they enter the processing chamber and is raised to plasma in the vicinity of the bottom surfaces of the each dielectric parts 31a.

(Supply of Silane Gas and Hydrogen Gas)

Following the argon gas plasma ignition, the second gas supply means 55 supplies a mixed gas (corresponds to the "second processing gas") containing silane gas and hydrogen gas from the silane gas supply source 43b4 and the hydrogen gas supply source 43b8 to the plurality of vertical gas nozzles 28 (see FIG. 2) secured at specific positions of the frame 26 via a second flow passage 42b and the second gas supply pipes 29b. The mixed gas containing the silane gas and the hydrogen gas is injected downward through the injection holes B open along the direction perpendicular to the substrate G (along the downward direction). Thus, the mixed gas is injected at a position where the mixed gas is not overly dissociated, which is set lower than the position at which the argon gas is sprayed.

The mixed gas thus injected is dissociated to the state of SiH3 radicals, which is a precursor essential for the formation of a good-quality film, with the electrical field energy having lost some of its intensity through the argon gas plasma generation. However, the mixed gas is not dissociated to the extent at which it becomes SiH2 radicals.

(Plasma Diffusion)

Since the longer side of the vertical gas nozzles 28 ranges parallel to the flow of the plasma onto the substrate G and the vertical gas nozzles 28 adopt a simple rod-like shape or plate-like shape, the vertical gas nozzles 28 do not block the flow of the plasma onto the substrate G. In addition, the vertical gas nozzles 28 are mounted so as to hang down like verticals from the frame 26 disposed at the ceiling of the processing container 10 so as not to block the flow of the plasma having been generated onto the substrate G as well.

As a result, a majority of ions and electrons contained in the plasma reach the substrate G without colliding with the vertical gas nozzles 28 and hardly any energy loss due to such collisions occurs. The plasma does not become decayed readily, allowing the deposition rate at the substrate G to be sustained at a level equal to or higher than a predetermined level. At the same time, with the SiH3 radicals resulting from the dissociation of the mixed gas to the precursor state essential for the formation of a good-quality film, a very good-quality amorphous silicon film can be formed on the substrate G.

The quantity of reaction product settled on the vertical gas nozzles 28 decreases in direct proportion to the quantities of ions and electrons colliding with the vertical gas nozzles 28. If the reaction product settles on the vertical gas nozzles 28 less readily, the period of time to elapse before the pile of the deposit becomes thicker than a certain level, the deposit peels off the vertical gas nozzles 28 due to the difference between the coefficient of thermal expansion of the material constituting the vertical gas nozzles 28 and the coefficient of thermal expansion of the deposit and the deposit thus peeled off becomes settled on the substrate G as particles, is lengthened. This, in turn, allows the cleaning cycle (interval) with which the processing chamber U is cleaned to be lengthened, to lead to an improvement in throughput. As a result, a high level of productivity is achieved.

Furthermore, since only smaller quantities of ions and electrons collide with the vertical gas nozzles 28, the vertical gas nozzles 28 are not overheated. The vertical gas nozzles 28, constituted of metal, achieve good heat conductivity. Thus, even when the vertical gas nozzles 28 become heated as ions and electrons collide with them, most of the heat having been applied to the vertical gas nozzles 28 is transmitted to the area near the cooling water pipes 44 outside the processing chamber U, where it is dissipated into cooling water circulating through the cooling water pipes 44. In other words, heat is not retained at the vertical gas nozzles 28.

As described above, less heat is applied to the vertical gas nozzles 28 during the processing operation and the heat that is applied to the vertical gas nozzles 28 is constantly released to the outside, preventing overheating of the vertical gas nozzles 28. As a result, the temperature at the vertical gas nozzles 28 fluctuates to a lesser extent as the processing operation and the substrate transfer operation are repeatedly executed. Thus, the deposit is not affected as much by the difference between the coefficient of thermal expansion of the deposit and the coefficient of thermal expansion of the material constituting the vertical gas nozzles 28, thereby, the deposit can be inhibited to separate readily from the vertical gas nozzles 28. Since this allows the cleaning cycle for the processing container 10 to be further lengthened, further improvement in throughput and productivity are achieved.

(Test Results)

The inventor worked out the specific design to be adopted in the microwave plasma processing apparatus 100 in the embodiment, which improves productivity, as described above, and executed an amorphous silicon CVD process with this microwave plasma processing apparatus 100.

The processing operation was executed under the following processing conditions; the pressure in the processing chamber U at 400 mTorr and the microwave power at 1.8 kW~2.6 kW (the three microwave generators 40 were used).

The operation was executed by using argon gas, silane gas and hydrogen gas, with the argon gas flow rate set at 1520 sccm, the silane gas flow rate set at 140 sccm and the hydrogen gas flow rate also set at 140 sccm. The temperature of the susceptor 11 (stage) was maintained at 370° C., the temperature of the substrate G was maintained at 300° C., the temperature at the cooling water supply source 45 was maintained at 80° C. and the waveguide had a width of 78 mm. It is to be noted that the glass substrate should measure 730 mm×920 mm or more, and the operation may be adopted in conjunction with glass substrates measuring 730 mm×920 mm in the G4.5 substrate size (the inner diameter of the chamber: 1000 mm×1190 mm) and 1100 mm×1300 mm in the G5 substrate size (the inner diameter of the chamber: 1470 mm×1590 mm), for instance.

Figure 5:
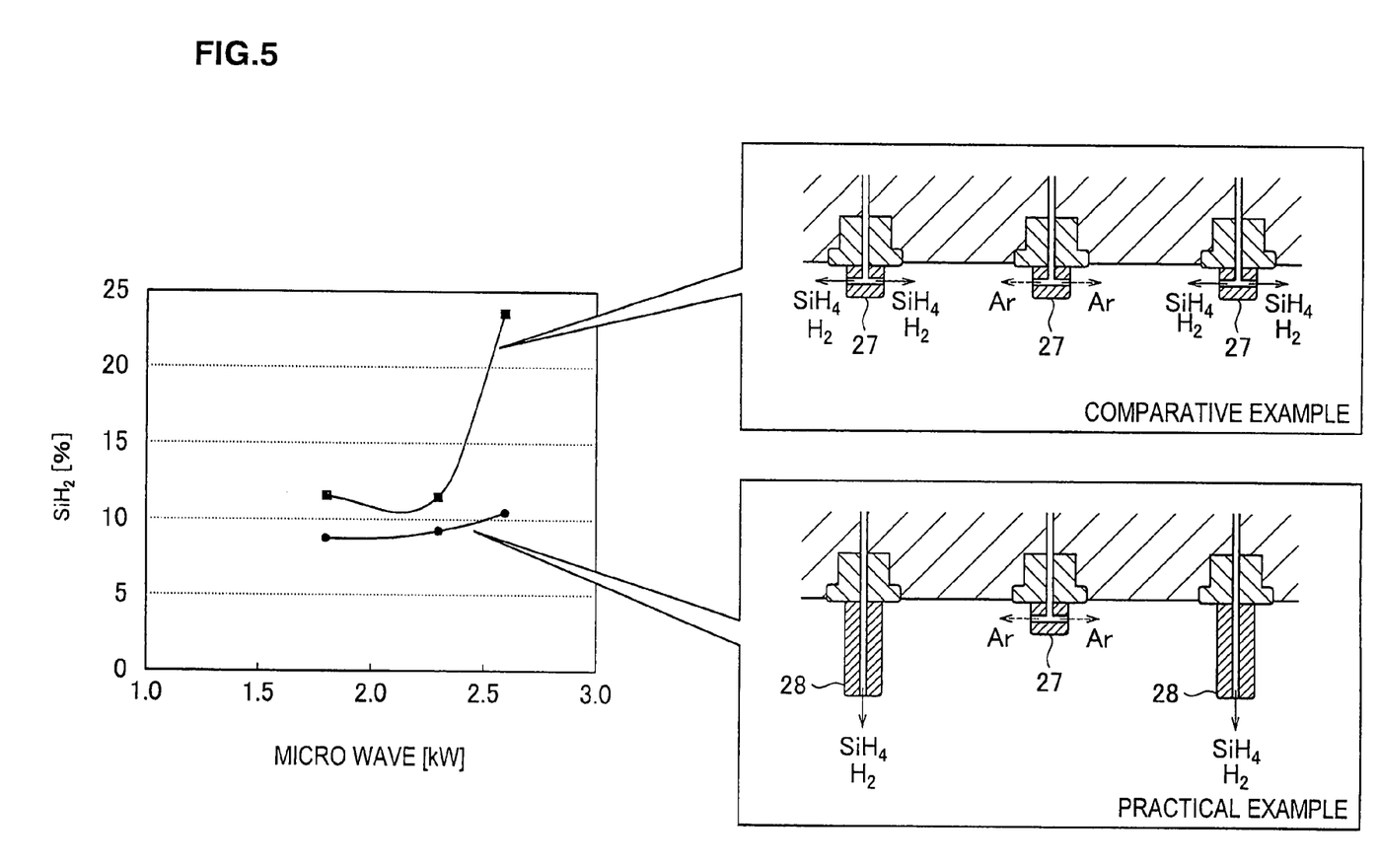
FIG. 5 shows the relationship between the microwave power and the SiH2 radical generation rate.

The test was executed by injecting the argon gas through the upper level (through the horizontal spray gas nozzles 27) and injecting the silane gas and the hydrogen gas through the lower level (through the vertical gas nozzles 28), as explained earlier in reference to the gas supply method according to the embodiment and also as illustrated as a practical example at the lower right in FIG. 5. In addition, the inventor also conducted a test as illustrated as the comparative example at the upper right in FIG. 5, whereby a microwave plasma processing apparatus equipped with the upper level injection members (horizontal spray gas nozzles 27) alone was utilized and alternate gas nozzles are used to inject the argon gas and the mixed gas constituted with the silane gas and the hydrogen gas.

The results of the tests are presented in the diagram on the left side in FIG. 5. As the diagram indicates, it was observed in the test conducted by using the microwave plasma processing apparatus in the comparative example that when the microwave power level was 1.8 kW~2.3 kW, the silane gas was over-dissociated to the SiH2 radical state at a rate of more than 10% and that when the microwave power level was raised from 2.3 kW to 2.6 kW, the rate at which the silane gas was over-dissociated to the SiH2 radical state showed a sudden increase to 24% from 10%.

In contrast, the test results obtained by using the microwave plasma processing apparatus 100 in the embodiment indicate that even when the microwave power level was increased from 1.8 kW to 2.6 kW, the rate at which the silane gas was over-dissociated to the SiH2 radical state remained under 10%.

The inventor was thus able to confirm that it is possible to sustain a desirable condition, in which the plasma is dissociated to the SiH3 radical state, i.e., the precursor essential for the formation of a good-quality film, but is not dissociated to the SiH2 radical state, in the microwave plasma processing apparatus 100 in the embodiment.

In particular, ions and electrons do not readily collide with the vertical gas nozzles 28 in the microwave plasma processing apparatus 100 achieved in the embodiment and thus, energy loss due to collisions does not occur readily, either. In other words, the extent of plasma decay was reduced and a good-quality amorphous silicon film could be formed on the substrate G while sustaining the deposition rate at the substrate G at or above a predetermined level. In short, the microwave plasma processing apparatus 100 achieved in the embodiment makes it possible to maintain a high level of productivity and form a high-quality film by raising the microwave power and thus increasing the film-forming speed.

In addition, the microwave plasma processing apparatus 100 in the embodiment did not allow a significant quantity of reaction product to be deposited on the vertical gas nozzles 28 and thus prevents overheating of the vertical gas nozzles 28. Consequently, it took longer for the pile of deposit to become thick, peel off the vertical gas nozzles 28 and settle on the substrate as particles. In other words, since the cleaning cycle for the processing chamber over which the inside of the processing chamber needs to be cleaned could be lengthened, a higher level of productivity was achieved.

Figure 6:
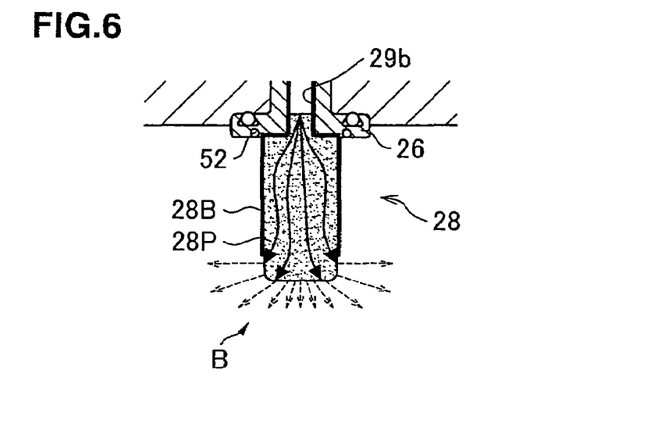
FIG. 6 shows another structural example that may be adopted in the icicle-shaped gas nozzles.
Figure 7:
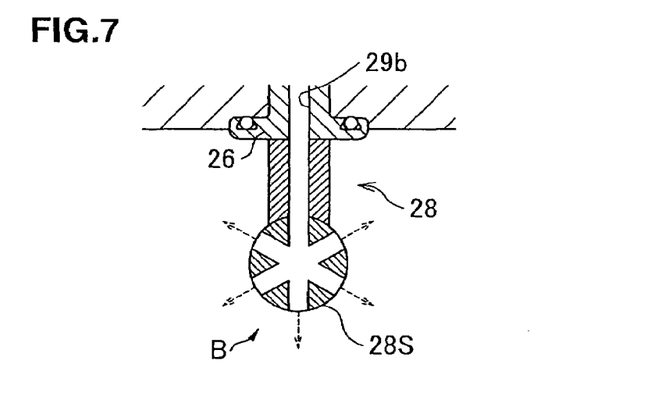
FIG. 7 shows yet another structural example that may be adopted in the icicle-shaped gas nozzles.
Figure 8:
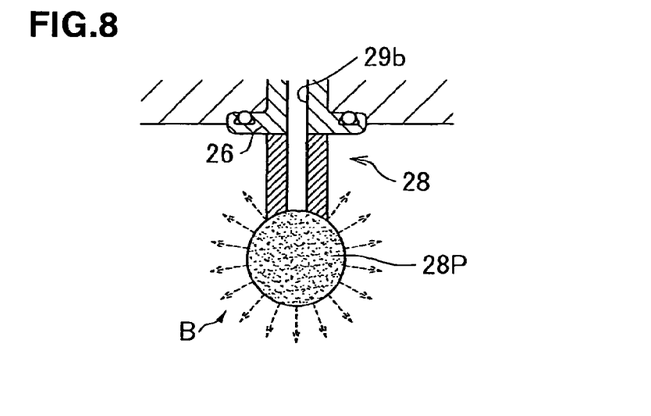
FIG. 8 shows yet another structural example that may be adopted in the icicle-shaped gas nozzles.

It is to be noted that any of the structures shown in FIGS. 6 through 8 may be adopted as a variation in the vertical gas nozzles 28 in the microwave plasma processing apparatus 100 in the embodiment.

(Variation 1)

An vertical gas nozzle 28 shown in FIG. 6 is constituted with a porous part 28P (porous member) and a bulk part 28B (dense member). More specifically, the portion of the vertical gas nozzle 28 where it connects with the second gas supply pipe 29b is constituted with the bulk part 28B, and the porous part 28P fills the inside of the bulk part 28B. In addition, at the bottom of the vertical gas nozzle 28, the porous part 28P projects out of the bulk part 28B so that the porous part 28P is partially exposed into the processing chamber U. It is to be noted that an O-ring 52 is fitted around the external circumference at the top of the vertical gas nozzle 28 over the bottom surface of the frame 26 so as to assure airtightness in the processing chamber U.

The second gas supply means 55 injects the silane gas and the hydrogen gas into the processing chamber U through injection holes A constituted with numerous openings (pores passing continuously through the porous part 28P) formed in the porous part 28P by passing the silane gas and the hydrogen gas through the porous part 28P at the vertical gas nozzle 28.

The average pore diameter of the pores at the porous part 28P should be 10~150 μm and the porosity of the porous part 28P should be approximately 20~40%. As a result, the silane gas and the hydrogen spread uniformly through the porous part 28P as they slow down gradually while passing through the pores passing continuously through the porous part 28P. Consequently, with their velocity reduced to approximately 0.3 m/s, the silane gas and the hydrogen gas are injected uniformly into the processing chamber U from the entire surface of the porous part 28P. In other words, the plasma generation is controlled in an optimal manner by inhibiting excessive agitation of the processing gases being supplied so that they are dissociated to the SiH3 radical state, i.e., the precursor essential for the formation of a good-quality film, but are not over-dissociated to the SiH2 radical state.

(Variation 2)

An vertical gas nozzle 28 shown in FIG. 7 has a spherical front end, with injection holes B formed in a radial pattern at the spherical front end 28S. The second gas supply means 55 injects the silane gas and the hydrogen gas radially into the processing chamber U through the injection holes B. This structure enables a uniform supply of the silane gas and the hydrogen gas over a wide area.

(Variation 3)

An vertical gas nozzle 28 shown in FIG. 8 has a spherical front end that is constituted with a porous part 28P. the silane gas and the hydrogen gas pass through the porous part 28P before they are supplied into the processing chamber U. As a result, the silane gas and the hydrogen gas can be uniformly supplied over a wide range at lower velocity.

In addition, although not shown, the first processing gas may be injected downward (along the direction perpendicular to the substrate G) into the processing chamber U through the openings at the ends of the first gas supply pipes 29a passing through the frame 26 without mounting the horizontal spray gas nozzles 27 at the bottom surface of the frame 26. In this case, the openings at the ends of the first gas supply pipes 29a correspond to the "first injection holes" and the first gas supply pipes 29a correspond to the "first gas injection members".

(Gas Supply Positions)

Generally speaking, it is desirable that the bond energy of the processing gas (the first processing gas) injected through the upper-level injection holes A may be greater than that of the processing gas (the second processing gas) injected through the lower level injection holes B (set lower than the positions of the injection holes A).

When the first processing gas and the second processing gas are injected selectively through specific injection holes, as described above, the first processing gas with the greater bond energy is first raised to plasma with the relatively intense microwave field energy. Following the plasma ignition of the first processing gas, the second processing gas with a lower bond energy compared to the first processing gas is injected through the injection holes B set at positions lower than the positions of the injection holes A and also lower than the position to which the frame 26 projects out. As a result, the second processing gas becomes dissociated to form the precursor essential for the formation of a good-quality film with the microwave field energy, the intensity of which has been reduced as its power has been used to raise the first processing gas to plasma. An amorphous silicon film is formed through this process.

Since the Ar ionization energy is 15.759 (eV) and the molecular bond energy with which Si and H become bonded is 3.2 (eV) and the molecular bond energy with which H and H become bonded is 4.48 (eV), it is concluded based upon the principle described above that argon with greater molecular bond energy compared to silane and hydrogen should be supplied as the first processing gas into the upper space of the processing container and the silane gas and the hydrogen gas should be supplied as the second processing gas into the lower space of the processing container during the amorphous silicon CVD process.

However, silane gas and oxygen gas, for instance, which are bound to induce an excessive reaction when mixed together, cannot be supplied as a mixed gas. In such a case, the injection positions for the individual processing gases should be determined so as not to induce any excessive reaction, regardless of the levels of the bond energy of the first processing gas and the second processing gas.

To summarize the microwave plasma processing apparatus 100 achieved in the embodiment of the present invention having been explained so far, the microwave plasma processing apparatus 100 includes the dielectric member 31 through which microwaves propagated through the rectangular waveguides 33 and passed through the slots 37 is transmitted, the plurality of horizontal spray gas nozzles 27 having formed therein the injection holes A and installed at specific positions of the frame 26 supporting the dielectric member 31, the plurality of vertical gas nozzles 28 having formed therein the injection holes B set lower than the injection holes A, which are installed at specific positions of the frame 26 where they do not block the flow of plasma toward the substrate G, the first gas supply means 50 that injects the first processing gas (e.g., argon gas) at a desired position inside the processing chamber U through the injection holes A of the horizontal spray gas nozzles 27, the second gas supply means 55 that injects the second processing gas (e.g., silane gas and hydrogen gas) at a position lower than the position at which the first processing gas is injected, through the injection holes B of the individual vertical gas nozzles 28, and the processing container 10 that includes the processing chamber U where the substrate G is plasma-processed by raising the first processing gas and the second processing gas to plasma with the microwaves.

In this structure, the plurality of horizontal spray gas nozzles 27 constituting the first gas injection members and the plurality of vertical gas nozzles 28 constituting the second gas injection members are mounted at the frame 26. The first gas supply means 50 injects the first processing gas such as argon gas through the injection holes A at the horizontal spray gas nozzles 27, whereas the second gas supply means 55 injects the second processing gas such as silane gas and hydrogen gas through the injection holes B (set lower than the injection holes A) formed at the vertical gas nozzles 28.

The vertical gas nozzles 28 are mounted at specific positions of the frame 26, at which they do not block the flow of plasma toward the substrate G. In other words, ions and electrons in the plasma generated from the first processing gas and the second processing gas do not readily collide with the vertical gas nozzles 28. This, in turn, reduces the quantity of reaction product deposited on the vertical gas nozzles 28. Since this prevents the pile of deposit from becoming thick, peeling off the vertical gas nozzles 28 and settling onto the substrate G as particles readily, the cleaning cycle (interval) with which the inside of the processing chamber U should be cleaned can be lengthened and the throughput can be improved as a result.

In addition, since ions and electrons do not readily collide with the vertical gas nozzles 28, energy loss due to collisions does not occur readily. As a result, the plasma hardly ever becomes decayed, which allows the deposition rate at the substrate G to be maintained at a level equal to or higher than a predetermined level and prevents overheating of the vertical gas nozzles 28.

The horizontal spray gas nozzles 27 may be mounted on the outside of the frame 26 or they may be installed inside the frame 26. For instance, the horizontal spray gas nozzles 27 may be installed at the bottom surface of the frame 26 or they may be constituted with gas supply pipes passing through the frame 26. In the former case, the openings at the ends of the gas passages formed in the gas nozzles constitute the injection holes A, whereas the openings at the ends of the first gas supply pipes 29a passing through the frame 26 constitute the injection holes A in the latter case.

The vertical gas nozzles 28 may be constituted of metal. In such a case, better thermal conductivity is achieved at the vertical gas nozzles 28 and, as a result, the heat applied to the vertical gas nozzles 28 as ions and electrons collide with the vertical gas nozzles 28 is transmitted to an area near the cooling water pipes 44 outside the processing chamber U, where the heat is dissipated via the cooling water circulating through the cooling water pipes 44. Consequently, the vertical gas nozzles 28 do not become overheated during the processing operation. As a result, the temperature at the vertical gas nozzles 28 fluctuates to a lesser extent as the processing operation and the substrate transfer operation are repeatedly executed. Thus, the deposit is not affected as much by the difference between the coefficient of thermal expansion of the deposit and the coefficient of thermal expansion of the material constituting the vertical gas nozzles 28, thereby, the deposit can be inhibited to separate readily from the vertical gas nozzles 28 and this allows for an even greater interval to elapse before it becomes necessary to clean the inside of the processing container 10.

The vertical gas nozzles 28 may each assume the shape of a rod or a plate. The vertical gas nozzles 28 may hang down from the frame 26 like verticals so that they extend along the direction perpendicular to the frame 26 over a range equal to or less than 30 mm. In addition, the vertical gas nozzles 28 may be fixed onto the frame 26 so as to hang down parallel to one another from the frame 26.

As described above, the plurality of vertical gas nozzles 28, assuming the shape of a rod or a plate, hang down parallel to one another from the frame 26 disposed at the ceiling of the processing container 10. Since the longer side of the vertical gas nozzles 28 extends parallel to the flow of the plasma traveling toward the substrate G and the vertical nozzles each assume a simple rod or plate shape, they do not readily block the flow of plasma toward the substrate G. In addition, since the vertical gas nozzles 28 are installed at specific positions so that they hang down by approximately 30 mm from the frame 26 disposed at the ceiling of the processing container 10, they do not block the flow of plasma having been generated from the first processing gas and the second processing gas and traveling toward the substrate G. By installing the vertical gas nozzles 28 at positions where they do not form a barrier that would block the diffusion of the plasma over the substrate G, as described above, it is ensured that most of the ions and electrons contained in the plasma will not collide with the vertical gas nozzles 28. As a result, the quantity of reaction product settling onto the vertical gas nozzles 28 is reduced and particles are not formed readily.

In addition, the injection holes B may be positioned so that the second processing gas is injected at a position at which it does not become over-dissociated. In conjunction with such injection holes B, the injection holes A may be made to open along the direction parallel to the substrate G in the vicinity of the dielectric member 31. The injection holes A may also be made to open along the direction running perpendicular to the substrate G. Furthermore, it is desirable that the first processing gas have a higher level of bond energy than the second processing gas.

When the first gas and the second processing gas are injected selectively through specific injection holes, as described above, the first processing gas with the greater bond energy is first raised to plasma with the intense microwave field energy of the microwaves having just entered the processing chamber U. The second processing gas is injected at a position further downward relative to the first gas injection position, at which the gas does not become over-dissociated. As a result, the second processing gas becomes dissociated to form the precursor essential for the formation of a good-quality film with the microwave field energy, the intensity of which has been reduced as its power has been used to raise the first processing gas to plasma.

For instance, a plasma excitation gas such as argon may be injected through the injection holes A open along the direction parallel to the substrate G over the area near the bottom surface of the dielectric member 31, and after uniform plasma is generated, silane gas and hydrogen gas may be injected through the injection holes B open along the direction perpendicular to the substrate G at a position at which the gases do not become over-dissociated (at a position further downward relative to the argon gas injection position). In this case, the injected silane ($SiH_4$) gas becomes dissociated to the $SiH_3$ radical state but does not become over-dissociated to the $SiH_2$ radical state. With the precursor resulting from the dissociation of the silane gas to the $SiH_3$ radical state, a good-quality film can be formed on the substrate G.

However, if at least either the first processing gas or the second processing gas is a mixed gas constituted with a plurality of different processing gas is and the processing gas constituents mixed together induce an excessive reaction, the injection positions for the individual processing gas constituents should be determined so as to avoid such an excessive reaction, regardless of the levels of bond energy of the first processing gas and the second processing gas.

In addition, the dielectric member 31 may be constituted with a plurality of dielectric parts 31a each having formed therein at least either a concave portion or a convex portion at its surface facing opposite the substrate G.

With such concave portions or convex portions formed at the individual dielectric parts 31a, a greater extent of electrical field energy loss can be induced when the surface wave is propagated at the bottom surfaces of the dielectric parts 31a. As a result, uniform plasma can be generated by minimizing the surface wave propagation and thus preventing occurrence of a standing wave.

In addition, part of each vertical gas nozzle 28 may be constituted with a porous material and the second gas supply means 55 may inject the second processing gas into the processing chamber U through the injection holes B constituted with a plurality of openings formed at the porous part by passing the second processing gas through the porous part formed at the vertical gas nozzle 28. The porous part may be formed as a spherical front end of the vertical gas nozzle 28.

Through this vertical gas nozzle 28, the second processing gas is supplied into the processing chamber U after traveling through the numerous openings at the porous part. As the second processing gas passes through the numerous pores passing continuously through the porous part, the velocity of the processing gas flow is reduced and the second processing gas spreads uniformly over the entire porous part. Then, the second processing gas is uniformly injected into the processing chamber through the openings present over the entire surface of the porous part in the decelerated state. By supplying the decelerated processing gas uniformly over a wide range, excessive agitation of the processing gas being supplied is prevented and plasma can be generated uniformly in a desirable manner. Through the vertical gas nozzle 28 that includes a porous part constituting a spherical front end thereof, in particular, the processing gas can be uniformly supplied over an even wider range through countless openings present at the spherical surface of the porous part.

Alternatively, the vertical gas nozzles 28 may each have a spherical front end, with injection holes B formed in a radial pattern at the spherical front end. In this case, the second gas supply means 55 injects the second processing gas into the processing chamber U through the injection holes B. Through the vertical gas nozzles 28 adopting this structure, the processing gas is evenly injected radially through the injection holes B formed at the spherical surfaces.

The operations of the individual units, executed in the embodiment as described above, are correlated and thus, they may be regarded as a series of operations by bearing in mind how they relate to one another. By considering them as a sequence of operations, the embodiment of the plasma processing apparatus according to the present invention can be remodeled as an embodiment of a plasma processing method.

Namely, the microwave plasma processing apparatus 100 can be remodeled as a plasma processing method including steps for: transmitting through the dielectric member 31 microwaves propagated through the rectangular waveguides 33 and passed through the slots 37, injecting the first processing gas (e.g., argon gas) at a desired position inside the processing chamber U through the injection holes A of the plurality of horizontal spray gas nozzles 27 mounted at specific positions of the frame 26 supporting the dielectric member 31, injecting the second processing gas (e.g., silane gas and hydrogen gas) at a position lower than the first processing gas injection position through the injection holes B set lower than the injection holes A, which are formed at the plurality of vertical gas nozzles 28 mounted at specific positions of the frame 26 so as not to block the flow of plasma traveling toward the substrate G and plasma processing the substrate G by raising to plasma the first processing gas injected and the second processing gas injected with the microwaves.

The vertical gas nozzles 28 are mounted at the specific positions of the frame 26 so as not to block the flow of plasma traveling toward the substrate G, as described above. Thus, most of the ions and electrons contained in the plasma do not collide with the vertical gas nozzles 28. This allows for a greater period of time to elapse before the deposit on the vertical gas nozzles 28 peels off and settles onto the substrate G as particles, since reaction product do not collect on the vertical gas nozzles 28 readily. As a result, the cleaning interval with which the inside of the processing container 10 needs to be cleaned is lengthened, which, in turn, improves the throughput.

Furthermore, the vertical gas nozzles 28 may be constituted of metal so as to quickly transmit the heat generated at the vertical gas nozzles 28 to the outside where the heat is dissipated into the cooling water supplied to the cooling water pipes 44. In this case, the heat having been applied to the vertical gas nozzles 28 can be removed efficiently. As a result, the temperature at the vertical gas nozzles 28 fluctuates to a lesser extent as the processing operation and the substrate transfer operation are repeatedly executed. Thus, the deposit is not affected as much by the difference between the coefficient of thermal expansion of the deposit and the coefficient of thermal expansion of the material constituting the vertical gas nozzles 28, thereby, the deposit can be inhibited to separate readily from the vertical gas nozzles 28 and this allows for a greater interval to elapse before it becomes necessary to clean the inside of the processing container 10.

While the invention has been particularly shown and described with respect to one embodiment thereof by referring to the attached drawings, the present invention is not limited to these examples and it will be understood by those skilled in the art that various changes in form and detail may be made therein without departing from the spirit, scope and teaching of the invention.

For instance, the plasma processing executed in the plasma processing apparatus according to the present invention does not need to be CVD processing, and the plasma processing apparatus according to the present invention may execute all types of plasma processing including ashing and etching.

What is claimed is:

1. A plasma processing apparatus, comprising:
    a processing chamber where a workpiece is processed with plasma generated by raising a gas to plasma with microwaves;
    a plurality of waveguides configured to allow a microwave to be transmitted;
    a slot antenna in which a plurality of slots is formed at bottom surfaces of the plurality of waveguides;
    a plurality of dielectric members configured to allow the microwave propagating through the plurality of waveguides and passing through the plurality of slots to be transmitted;
    a latticed frame configured to support multiple rows of the plurality of dielectric members disposed in a regular pattern on a ceiling of the processing chamber;
    a plurality of horizontal spray gas nozzles including first injection holes, the plurality of horizontal spray gas nozzles being fixed onto a bottom surface of the latticed frame, and being configured to project out toward an upper surface of a workpiece, the first injection holes opening along a direction parallel with the upper surface of the workpiece; and
    a plurality of vertical spray gas nozzles including second injection holes, the plurality of vertical spray gas nozzles being fixed onto the bottom surface of the latticed frame, and being configured to project out toward the upper surface of the workpiece and to hang out from the latticed frame, a length of each of the plurality of vertical spray gas nozzles being longer than a length of each of the plurality of horizontal spray gas nozzles, the second injection holes opening along a direction perpendicular to the upper surface of the workpiece, and wherein
    each row of the plurality of horizontal spray gas nozzles and vertical spray gas nozzles is disposed alternately in a direction parallel with a longer extending direction of the plurality of waveguides at the bottom surface of the latticed frame, and the plurality of slots and each row of the plurality of horizontal spray gas nozzles and vertical spray gas nozzles are disposed in a regular pattern over the ceiling of the processing chamber, and wherein a distance from each of the plurality of slots to a closest horizontal spray gas nozzle or vertical spray gas nozzle is uniform.

2. The plasma processing apparatus according to claim 1, wherein:
    the plurality of horizontal spray pas nozzles is mounted outside the latticed frame or is installed inside the latticed frame.

3. The plasma processing apparatus according to claim 1, wherein:
    the plurality of vertical spray pas nozzles is constituted of metal.

4. The plasma processing apparatus according to claim 1, wherein:
    the plurality of vertical spray pas nozzles each assumes a shape of a rod or a plate.

5. The plasma processing apparatus according to claim 1, wherein:
    the plurality of vertical spray gas nozzles is fixed onto the bottom surface of the latticed frame so as to hang down vertically from the latticed frame in parallel with one another.

6. The plasma processing apparatus according to claim 1, wherein:
    the plurality of vertical spray gas nozzles is disposed at positions at which the plurality of vertical spray gas nozzles does not form a barrier that would block plasma being diffused over the workpiece.

7. The plasma processing apparatus according to claim 1, wherein:
    the plurality of vertical spray gas nozzles each projects out from the bottom surface of the latticed frame by 30 mm or less.

8. The plasma processing apparatus according to claim 1, wherein:
    the second injection holes are set at positions at which a processing gas is injected through the second injection holes at a position such that the processing gas does not become over-dissociated.

9. The plasma processing apparatus according to claim 1, wherein
the plurality of vertical spray gas nozzles each includes a porous part, the plasma processing apparatus further comprising:
a gas supply means configured to inject a processing gas into the processing chamber through the second injection holes constituted with a plurality of openings present at the porous part by passing the processing gas through the porous part.

10. The plasma processing apparatus according to claim 9, wherein:
the porous part constitutes a spherical front end of each of the plurality of vertical spray gas nozzles.

11. The plasma processing apparatus according to claim 1, wherein:
the plurality of vertical spray gas nozzles each has a spherical front end; and
the second injection holes are formed in a radial pattern at the spherical front end; the plasma processing apparatus further comprising:
a gas supply means configured to inject a processing gas radially into the processing chamber through the second injection holes.

12. The plasma processing apparatus according to claim 1, further comprising:
a first gas supply means configured to inject a first processing gas and a second gas supply means configured to inject a second processing gas, wherein at least either the first processing gas or the second processing gas is a mixed gas obtained by mixing a plurality of processing gas constituents; and
unless the mixed gas induces an excessive reaction, the first processing gas achieves greater bond energy than the second processing gas.

13. The plasma processing apparatus according to claim 1, wherein:
the dielectric members are constituted with a plurality of dielectric parts; and
the dielectric parts each include at least either a concave portion or a convex portion formed at a surface thereof opposing the workpiece.

14. The plasma processing apparatus according to claim 1, wherein:
a plurality of slots is provided for each of the dielectric members at positions where the waveguides Y-branched from a microwave generator and each row of the dielectric members intersect in a regular pattern facing the ceiling of the processing chamber.

15. The plasma processing apparatus according to claim 1, comprising:
a first gas supply means configured to inject a first processing gas to a desired position within the processing chamber through the first injection holes at each of the plurality of horizontal spray gas nozzles; and
a second gas supply means configured to inject a second processing gas through the second injection holes at each of the plurality of vertical spray gas nozzles to a position lower than the position at which the first processing gas is injected.

* * * * *